(12) United States Patent
Chen et al.

(10) Patent No.: US 6,830,996 B2
(45) Date of Patent: Dec. 14, 2004

(54) DEVICE PERFORMANCE IMPROVEMENT BY HEAVILY DOPED PRE-GATE AND POST POLYSILICON GATE CLEAN

(75) Inventors: Chia-Lin Chen, Hsin-Chu (TW); Tze Liang Lee, Hsin-Chu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 10/395,345

(22) Filed: Mar. 24, 2003

(65) Prior Publication Data

US 2004/0192017 A1 Sep. 30, 2004

(51) Int. Cl.$^7$ .................. H01L 21/3205; H01L 21/31
(52) U.S. Cl. .................. 438/585; 438/758; 438/778
(58) Field of Search .................. 438/142, 197, 438/584, 585, 758, 778

(56) References Cited

U.S. PATENT DOCUMENTS

| | | | |
|---|---|---|---|
| 5,371,396 A | 12/1994 | Vinal et al. | |
| 5,521,127 A | 5/1996 | Hori | |
| 5,710,450 A | 1/1998 | Chau et al. | |
| 5,840,125 A | 11/1998 | Gronet et al. | |
| 5,943,230 A | 8/1999 | Rinnen et al. | |
| 5,959,333 A | 9/1999 | Gardner et al. | |
| 6,020,260 A | 2/2000 | Gardner | |
| 6,099,647 A | 8/2000 | Yieh et al. | |
| 6,110,812 A | 8/2000 | Ho et al. | |
| 6,114,258 A | 9/2000 | Miner et al. | |
| 6,159,866 A | 12/2000 | Gronet et al. | |
| 6,207,304 B1 | 3/2001 | Law et al. | |
| 6,242,776 B1 | 6/2001 | Hause et al. | |
| 6,323,094 B1 | 11/2001 | Wu | |
| 6,326,664 B1 | 12/2001 | Chau et al. | |
| 6,399,445 B1 | 6/2002 | Hattangady et al. | |
| 6,402,850 B1 | 6/2002 | Beinglass et al. | |
| 6,410,090 B1 | 6/2002 | Wang | |
| 6,413,871 B2 | 7/2002 | M'Saad et al. | |
| 6,450,116 B1 | 9/2002 | Noble et al. | |
| 6,455,406 B1 * | 9/2002 | Linderer et al. | ............ 438/592 |
| 6,482,726 B1 | 11/2002 | Aminpur et al. | |
| 6,488,776 B2 | 12/2002 | Wang | |
| 6,518,203 B2 | 2/2003 | Narwankar et al. | |
| 6,534,401 B2 * | 3/2003 | Joo et al. | ............ 438/653 |
| 2002/0009900 A1 | 1/2002 | Tay et al. | |

OTHER PUBLICATIONS

F. Arnaud and M. Bidaud, *Gate Oxide Process Impact on RNCE for Advanced CMOS Transistors*, Sep. 2002, Firenze, Italy.
*Decoupled Plasma Nitridation (DPN)*, May, 2001, Foresight, pp. 43–45.
*Technology Challenges for 100nn and Beyond Transistor and Capacitor Fabrication*: Fig. 8; Feb. 18, 2003, p. 1.
*Gate Stack*; Feb. 17, 2003, p. 1.

(List continued on next page.)

Primary Examiner—Robert Pascal
Assistant Examiner—Scott B. Geyer
(74) Attorney, Agent, or Firm—Haynes and Boone, LLP

(57) ABSTRACT

The present disclosure provides a method is provided for fabricating a metal oxide semiconductor (MOS) gate stack on a semiconductor substrate. The method includes generating moisture on a surface of the semiconductor substrate to form an oxide layer less than 10 nanometers thin and performing a nitridation process on the thin oxide layer. After the nitridation process, the method includes performing a polysilicon deposition process on the surface of the semiconductor substrate, doping the polysilicon deposition to a level of 5×1015 at/cm3, and cleaning the doped polysilicon with a light ammonia solution.

19 Claims, 5 Drawing Sheets

OTHER PUBLICATIONS

R. Zonca, B. Crivelli, M. L. Polignano, F. Cazzaniga, M. Alessandri, A. P. Caricato, M. Bersani, M. Sbetti, L. Vanzetti, G. C. Xing, G. E. Miner, N. Astici, S. Kuppurao, D. Lopes, S. Nesso, *Ultra Thin NO/N$_2$O Oxynitride Dielectric for Advanced Flash Memory Application: Single Wafer and Batch Technology*; pp. 1–6.

Gene Li, *Total Solutions for Front–End Thermal Processing*; Foresight, May, 2001, pp. 41–42.

* cited by examiner

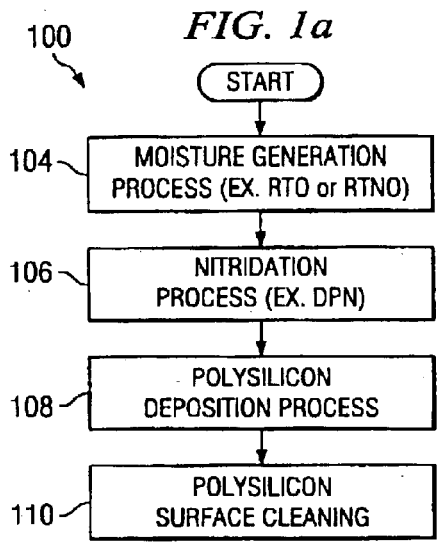
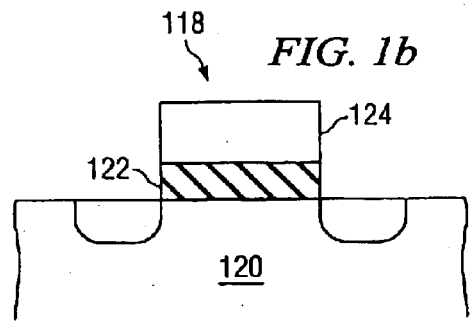
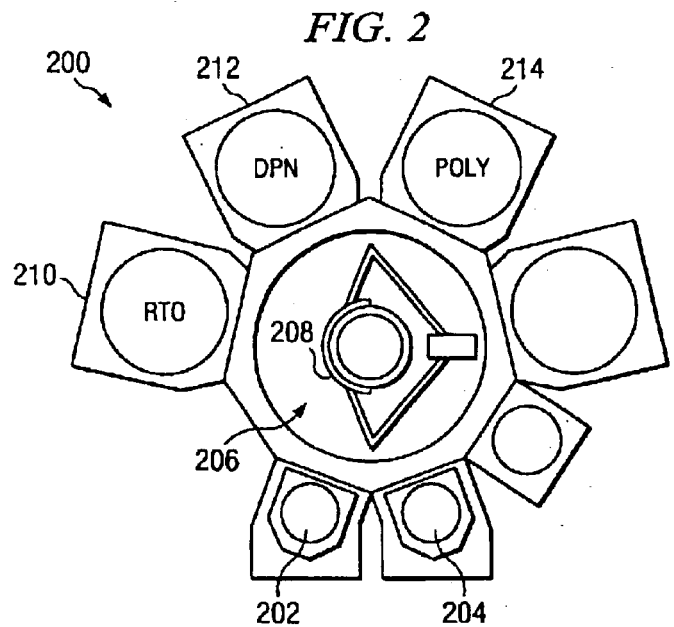

DEVICE PERFORMANCE IMPROVEMENT BY HEAVILY DOPED PRE-GATE AND POST POLYSILICON GATE CLEAN

BACKGROUND OF THE INVENTION

The present invention relates generally to the field of semiconductor processing, and more specifically to a method for improving negative channel metal oxide semiconductor (NMOS) device performance for 0.1 micron or smaller complementary metal oxide semiconductor (CMOS) technology on a semiconductor substrate.

Semiconductor device geometries continue to dramatically decrease in size since such devices were first introduced several decades ago. Since then, integrated circuits have generally followed the two year/half-size rule (often called Moore's Law), which means that the number of devices on an integrated circuit chip doubles every two years. Today's fabrication plants are routinely producing devices having 0.1 $\mu$m and even 90 nm feature sizes and smaller. Solving the problems associated with new process implementations and equipment technology as well as device requirements have become increasingly challenging.

High integration chips with shrinking device geometries require substrate processing systems to meet the demands for forming ultra thin MOS gates and ultra-shallow doped regions. With the advent of smaller device geometries, ultra-shallow doped regions in semiconductors are needed for various applications.

Traditional approaches to forming ultra-shallow doped regions, such as ion implantation and gaseous diffusion, are inadequate in some applications. These approaches have only a limited ability to control dopant distribution and junction depth, especially as the doped regions become shallower. Ion implantation control over dopant distribution is difficult due to a concentration of ions which build up at the surface of the semiconductor material. Also, ion implantation causes damage to the semiconductor surface, and methods of repair often create difficulties with controlling dopant distribution and junction depth for ultra-shallow doped regions. For example, ions bombarded at relatively high energy levels have a tendency to tunnel through the semiconductor material causing damage such as point defects. These point defects, which can lead to irregular and non-uniform junction depths, may be fixed by annealing the implanted semiconductor material at high temperatures. However, this annealing of the implanted semiconductor material may increase the junction depth further than desired.

In gaseous diffusion, controlling dopant distribution and junction depth is difficult when forming ultra-shallow doped regions. As technology progresses to allow even smaller geometry devices, an alternative approach which provides greater control over the dopant uniformity and junction depth in ultra-shallow doped regions is needed.

Another method of forming ultra-shallow doped regions is the use of a doped dielectric film as a dopant diffusion source. In this alternative approach, a doped dielectric film is deposited onto a substrate and used as a source of dopants to be diffused into the substrate to form ultra-shallow doped regions. A method and apparatus for use of this doped dielectric film is discussed in U.S. Pat. No. 6,099,647, which is hereby incorporated by reference.

Another process that requires improvement as device geometries shrink is the formation of the gate stack, a critical component of the metal oxide semiconductor field effect transistor (MOSFET). The fabrication of the MOS gate stack, which typically comprises a gate oxide, polysilicon, and sometimes a metal silicide, is becoming more challenging as process technology begins to facilitate production of 0.1 micron geometries and smaller. Due to the sensitive nature of the gate stack fabrication, processing has begun to be performed in single substrate processing chambers. The vacuum environment of these chambers greatly reduces the number of particulates that contaminate the surfaces of the wafers, thereby improving the device yield. A vacuum system may include a central robotic transfer chamber coupled with various processing chambers. One example of this type of vacuum system is the Single Wafer Thermal Process Cell (SWTPC), which can be purchased from Applied Materials Inc. of Santa Clara, Calif. The SWTPC is a front-end, single wafer processing system that includes process modules for gate oxidation via an insitu $H_2O$ vapor rapid thermal process chamber, a decoupled plasma nitridation (DPN) process chamber, and a polysilicon deposition chamber.

The increasing problems of excessive gate leakage current in ultra thin oxide and dopant impurity penetration have become major obstacles to the continued downscaling of dual gate CMOS technology. Recently, the use of ultra-thin nitride/oxide (N/O) stack gate dielectric and a decoupled nitrogen plasma source (DPN) has been proposed as a viable alternative to using silicon dioxide as a MOS gate material for 0.1 micron device geometries. These materials have good impurity diffusion barrier properties and low gate leakage current densities. Shrinking the dielectric thickness in nitride/oxide stack film or nitrided oxide, however, is difficult. Pre-gate doping can effectively shrink the NMOS equivalent oxide thickness (EOT) without causing an increase in leakage current. EOT is a value used to compare the performance of MOS gate dielectrics having a dielectric constant greater than $SiO_2$, while having the performance of $SiO_2$ MOS gates. EOT indicates the thickness of $SiO_2$ gate oxide required to obtain a gate capacitance equal to the capacitance obtained with a dielectric thicker than $SiO_2$ and featuring a higher dielectric constant k. For example, the EOT for a 10 nm thick dielectric featuring a k=39 would be 1 nm (k of $SiO_2$ is 3.9). However, pre-gate doping is of only limited use due to an increase in leakage current. The increase in leakage current is due mainly to the enhanced polysilicon gate activation rate which is well know by those skilled in the art.

SUMMARY OF THE INVENTION

The present invention provides a method for fabricating a metal oxide semiconductor (MOS) gate stack on a semiconductor substrate. In one embodiment, the method includes generating moisture on a surface of the semiconductor substrate, performing a nitridation process on the moistened substrate, and after the nitridation process, performing a polysilicon deposition process on the surface of the semiconductor substrate. The polysilicon is then cleaned. The cleaning can utilize such features as ammonia hydroxide, megasonic agitation, and de-ionized water.

In some embodiments, the moisture is generated using a rapid thermal oxidation process or a rapid thermal oxynitridation process.

In another embodiment, a method is provided for creating a gate for a device in a semiconductor substrate. The method includes forming a relatively thin gate dielectric on the substrate, depositing a layer of polysilicon over the thin gate dielectric, doping the polysilicon to a relatively high doping level, and cleaning the polysilicon layer with a cleaning solution including ammonia hydroxide.

In some embodiments, the relatively high doping level is greater than or equal to 5×1015 at/cm3 and the thin gate dielectric is less than or equal to 10 nanometers in thickness.

In another embodiment, a method is provided for fabricating a metal oxide semiconductor (MOS) gate stack on a semiconductor substrate. The method includes generating moisture on a surface of the semiconductor substrate to form an oxide layer less than 10 nanometers thin and performing a nitridation process on the thin oxide layer. After the nitridation process, the method includes performing a polysilicon deposition process on the surface of the semiconductor substrate, doping the polysilicon deposition to a level of 5×1015 at/cm3, and cleaning the doped polysilicon with a light ammonia solution.

In some embodiments, the step of cleaning further includes performing megasonic agitation and/or sweeping the ammonia solution across the surface of the semiconductor substrate.

BRIEF DESCRIPTION OF THE DRAWINGS

FIG. 1a is a flow chart of a MOS gate stack process.

FIG. 1b is a cross sectional view of a transistor being processed according to the MOS gate stack process of FIG. 1a.

FIG. 2 is a plane view of a cluster tool in which the gate stack process steps of FIG. 1a can be performed.

DETAILED DESCRIPTION

Figure 3:
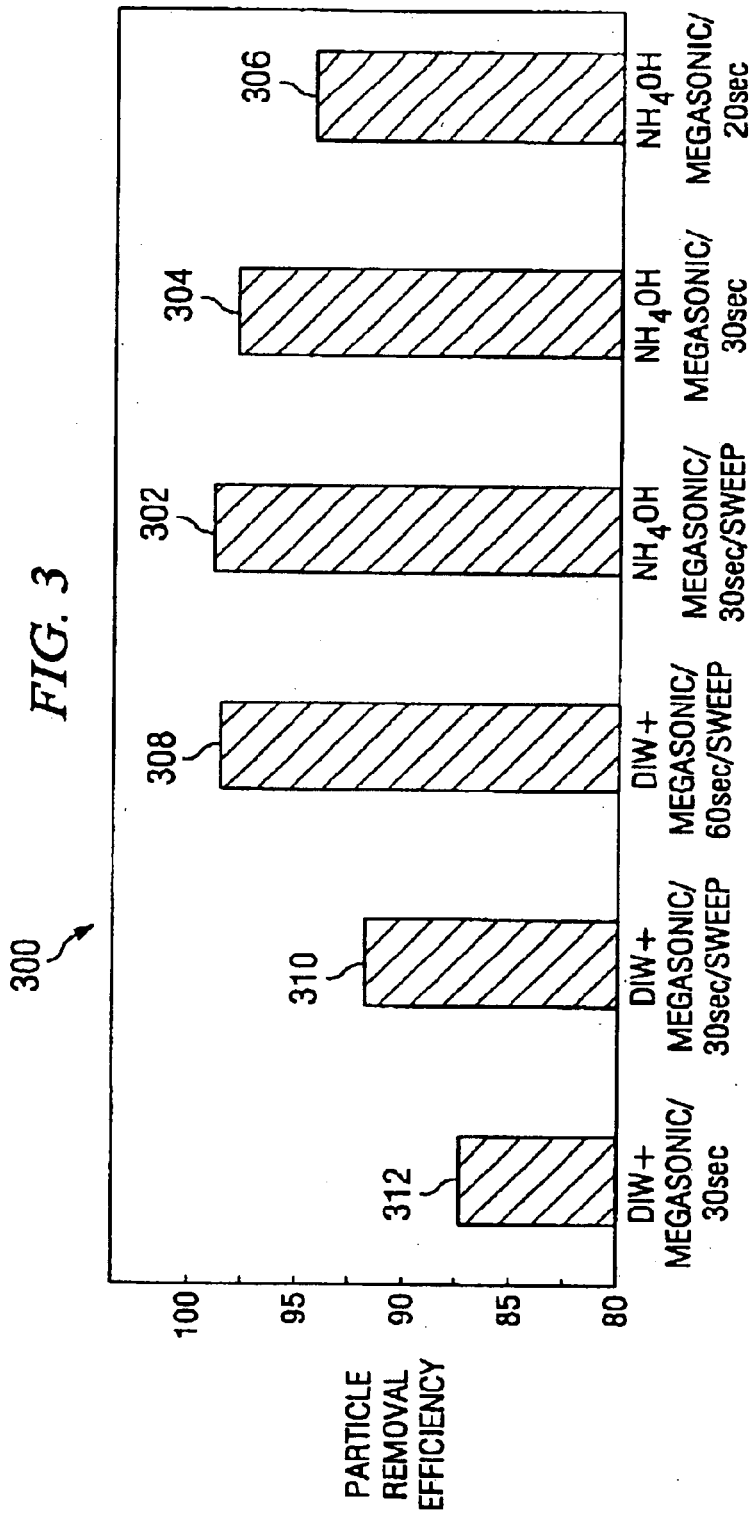
FIG. 3 is a bar chart that illustrates the particle removal efficiency of an optimized post polysilicon wet clean process according to one embodiment of the present invention.

The present invention provides a method for improving device performance, such as an NMOS device developed using 0.1 micron CMOS technology on a semiconductor substrate. Several process improvements and/or implementations improve EOT without having an increase in leakage current $J_g$. In some embodiments, this allows for the fabrication of shallower ultra shallow junctions. It is understood, however, that this specific example is only provided to teach the broader inventive concept, and one of ordinary skill in the art can easily apply the teachings of the present disclosure to other semiconductor devices and structures. Also, it is understood that the process discussed in the present disclosure includes and/or utilizes many conventional processes and structures in a new and unique manner. Since these conventional processes and structures are well known in the art, they will only be discussed in a general level of detail.

Excessive gate leakage current ($J_g$) in ultra thin MOS structures with geometries less than 0.1 micron can result from an assortment of process parameters, such as gate oxide nitrogen content, pre-gate or polysilicon doping concentration, polysilicon line width recession, and many other related factors. The present disclosure can help to reduce excessive gate leakage current in various ways, such as utilizing a series of front end semiconductor manufacturing processes for the fabrication of the gate stack in a CMOS process flow. Currently, this gate stack fabrication is performed with a single wafer process rather than a batch process, but the present invention may also be applicable to batch processing.

Referring to FIGS. 1a and 1b, a fabrication process 100 (FIG. 1a) can be used to create a gate stack 118 (FIG. 1b) on a silicon substrate 120 of arbitrary dimensions, however in the present example, the substrate is described as a wafer. The wafer 120 may have already completed several other processes, such as including necessary wells and layers for a transistor device. The first step of the present discussion is an insitu moisture generation process 104. The moisture generation process 104 may utilize rapid thermal oxidation or rapid thermal oxy-nitridation (RTO or RTNO). During this process, $H_2O$ steam is formed in the same chamber where the substrate to be oxidized is located. A reactant gas mixture comprising a hydrogen containing gas such as $H_2$ or $NH_3$ and an oxygen containing gas such as $O_2$ and $N_2O$, can be fed into the reaction chamber where a substrate is located. Introducing gases other than hydrogen and oxygen into the process gas mix can provide certain benefits. For example, an oxygen gas containing nitrogen could be important to further nitride the oxide, forming an oxy-nitride (RTNO). An example method for forming oxy-nitride is taught in U.S. Pat. No. 6,207,304, hereby incorporated by reference. The oxy-nitride can further deter dopant diffusion from the pre-gate doping of polysilicon.

Referring also to FIG. 2, once the reactant gas mixtures are selected, the oxygen containing gas and the hydrogen containing gas react to form $H_2O$ steam in a reaction chamber 210. The reaction of the hydrogen containing gas can be catalyzed by heating the wafer to a temperature sufficient to cause the moisture reaction. Because the heated wafer can be the ignition source for the reaction, the vapor generation reaction can occur in close proximity to the wafer surface. Reactant gas concentrations and partial pressures can be controlled to prevent spontaneous combustion within the chamber 210 before the wafer reaches the desired temperature. Once that temperature is reached, formation of water vapor occurs by spontaneous combustion of the entire volume of reactant gas. The ratio of the reactant gases can greatly affect device electrical characteristics. The moisture generation process 104 can also be influenced by the temperature ramp rate and the dwell time at the process temperature. The process 104 can be very quick, for example, 30–120 seconds.

The insitu moisture generation process 104 can occur, preferably, under a reduced pressure in single wafer chamber of a rapid thermal processor. This RTO process utilizing insitu moisture generation is ideally suited for oxidizing silicon film or substrate in the formation of modern ultra high density integrated circuits. The RTO or RTNO may be used to form a thin gate oxide 122 but may also be used to oxidize any form of doped or undoped silicon including epitaxial, amorphous, or polycrystalline.

Referring again to FIGS. 1a and 1b, to prevent dopants from diffusing through the thin oxide 122 and to improve device reliability and performance, an insitu or exsitu plasma nitridation process 106 may be performed following the oxidation that occurs during the moisture generation process. The substrate 120 can undergo a nitridation process whereby nitrogen may be incorporated into the substrate. The present invention can utilize decoupled plasma nitridation (DPN) wherein the composition of the plasma is predominantly free radicals. The nitrogen free radicals are a plurality of positively charged ions and electrons excited by a radio frequency (RF) antenna source. The reaction of a nitrogen plasma with the substrate results in a relatively damage-free dielectric layer 122. Free radical or ion bombardment energy can be controlled by an RF or DC bias to the substrate.

Following the nitridation process 106, a polysilicon gate 124 can be formed by a polysilicon process 108. The polysilicon process 108 can utilize a conventional furnace technique, a single wafer process within a cluster tool, or by other methods known by one who is skilled in the art. In the present example, the polysilicon deposition process 108 is accomplished by chemical vapor deposition (CVD) where dopants can be incorporated into the polycrystalline film insitu. The n-type dopants can be, for example, arsenic or phosphorous, and a p-type dopant can be, for example, boron. The process can occur in a low or reduced pressure environment or at another desired process pressure. A low pressure environment may be preferable to provide for the low deposition rates critical in forming MOS geometries of less than 0.1 micron. The process temperature can be an arbitrary temperature, however it may be preferable to process at a low temperature within or below the thermal budget of the device process flow and specification. One example of an apparatus for implementing the polysilicon process 108 is described in U.S. Pat. No. 6,410,090, hereby incorporated by reference, which teaches an insitu single substrate method for forming a doped polysilicon film. The doping level for the polysilicon 124 can be relatively heavy, such as in the range from $5 \times 10^{15}$ at/cm$^3$ to $1 \times 10^{16}$ at/cm$^3$ or higher. The polysilicon deposition process 108 can produce particles which can have a dramatic effect on device reliability and device yield.

A wet or chemical cleaning process 110 can be performed on the substrate after the application of a doped polysilicon film 108. The cleaning process 110 may use a process chemistry suited to cleaning contaminants and other debris from the polysilicon surface. Ammonia hydroxide, $NH_4OH$, is one example of a cleaner which can be used and is the cleaner on which the succeeding figures are based. Process parameters can play an important role in reducing the total number of contaminants and particles after the polysilicon deposition 108. The cleaning process 110 can select process parameters, including ultrasonic (or megasonic) application, process time, and $NH_4OH$ concentration, to achieve the optimal process condition.

Referring now to FIG. 2, the process steps of moisture generation 104, plasma nitridation 106, and the polysilicon gate deposition process 108 can be carried out on a cluster tool 200 which allows the wafer to be transported between process steps 104, 106, and 108 without exposure to the atmosphere. The polysilicon surface cleaning 110 may or may not be performed in the cluster tool.

The cluster tool 200, such as the Centura® platform provided by Applied Materials Inc., can be used to improve cycle time and prevent substrate contamination between process steps 104, 106, and 108. The cluster tool 200 typically consists of two load-lock chambers 202 and 204 for substrate loading and unloading, a transfer chamber 206 with a robotic arm 208, and attached process chambers 210, 212, 214 for carrying out process steps 104, 106, and 108.

The insitu moisture generation process 104 can be carried out in a rapid thermal heating apparatus 210, such as but certainly not limited to, the RTP Centura® platform with a Honeycomb Source™, as provided by Applied Materials Inc. Other types of thermal reactors include the Epi or Poly Centura single wafer "cold wall" reactor also provided by Applied Materials Inc. used to form high temperature films (HTF) such as epitaxial silicon, polysilicon, oxides, and nitrides. Further detail for an RTP apparatus and method for providing for an insitu vapor oxidation is provided in U.S. Pat. No. 6,159,866, hereby incorporated by reference.

The plasma nitridation process 106 can be carried out in chamber 212. The apparatus or system 200 that provides for the DPN 106 could include a rapid thermal processing (RTP) apparatus, such as, but not limited to, the RTP Centura® with a Honeycombed Source™ or Dielectricx™ also provided by Applied Materials, Inc. The apparatus 212 may have a plasma source or a method for generation of plasma free radicals. The plasma source may be coupled to an RTP apparatus or may be a separate process apparatus. An example of an RTP and nitridation plasma source combination is illustrated in U.S. Pat. No. 6,450,116, hereby incorporated by reference.

Referring now to FIG. 3, a bar chart 300 illustrates the efficiency of particle removal under various wet cleaning methods 302, 304, 306, 308, 310, 312 for use by the cleaning process 110 (FIG. 1a). Each of the methods 302–312 use various combinations of de-ionized water (DIW), a light $NH_4OH$ cleaning system, megasonic cleaning (e.g., megasonic agitation or scrubbing), and a chemical sweeping-type system (sweep). One example of a light $NH_4OH$ cleaning system is an AM1 or AMAT cleaning system provided by Applied Materials Inc. In wet cleaning method 302, a recipe is used in concert with process parameters including a light $NH_4OH$ cleaning system, megasonic cleaning, a chemical sweep, and a short processing time of approximately 30 seconds. As the chart 300 indicates, by utilizing the method 302, the cleaning process 110 allows for an optimal removal of surface contaminates from the polysilicon layer which, in turn, provides significant improvement in electrical device characteristics. It is understood that other methods 304–312 may also be desirable for different reasons.

Figure 4:
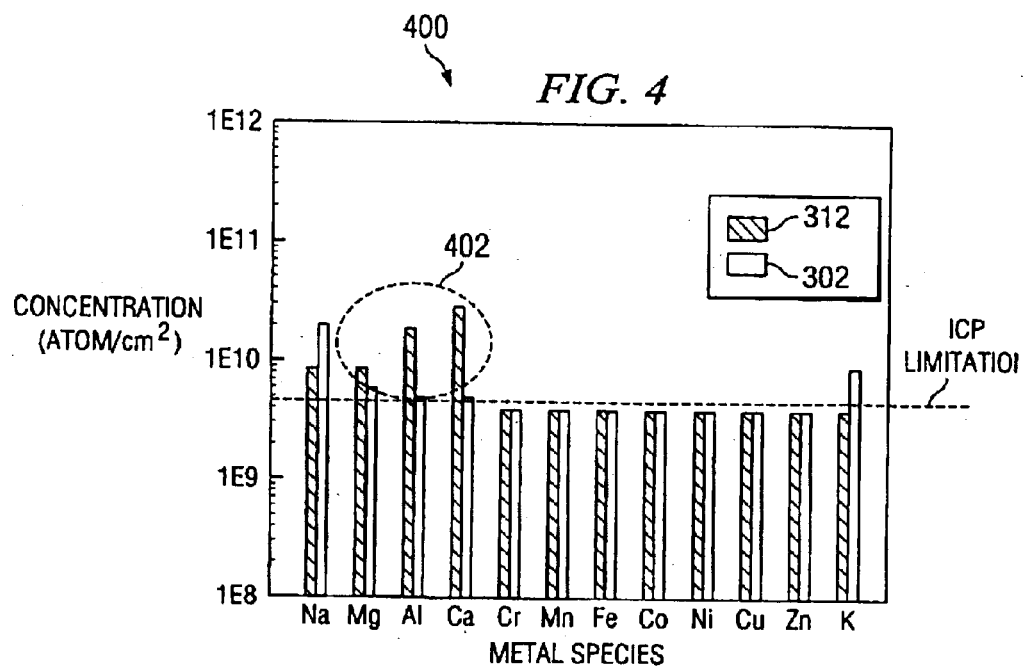
FIG. 4 is a bar chart that illustrates the reduction of metal contaminates by an optimized post polysilicon wet clean according to one embodiment of the present invention.

Referring now to FIG. 4, a bar chart 400 shows the significant reduction of metal contaminates 402, such as Mg, Al, and Ca, that can result from the use of $NH_4OH$ concentration cleaning method 302, as compared to the DIW cleaning method 312.

The $NH_4OH$ concentration cleaning method 302 can be implemented at other stages within the device process flow, including prior to or after the n channel lightly doped drain (LDD), after the anneal of the n-channel LDD, after or before the high temperature oxidation spacer, and after or before the moisture generation process 104.

The $NH_4OH$ concentration cleaning method 302 provides many additional benefits. The method 302 minimizes the polysilicon width consumption that can occur with cleaning recipes 304, 306, 308, 310, 312. The method 302 shows very little attack or consumption of silicon.

Also, utilizing the method 302 with the cleaning process 110 (FIG. 1a) results in a relatively small amount of silicon recession and minimal polysilicon line recession, as compared to the methods 304–312. The significant reduction in silicon substrate and the polysilicon line strongly indicate that increased doping of the polysilicon gate or pre-gate doping can be added to the polysilicon deposition process 108. Increasing the doping concentration can lead to an improvement in the drain current without the gate leakage current $J_g$ increasing and without extra threshold voltage $V_1$ roll-off.

Figure 5:
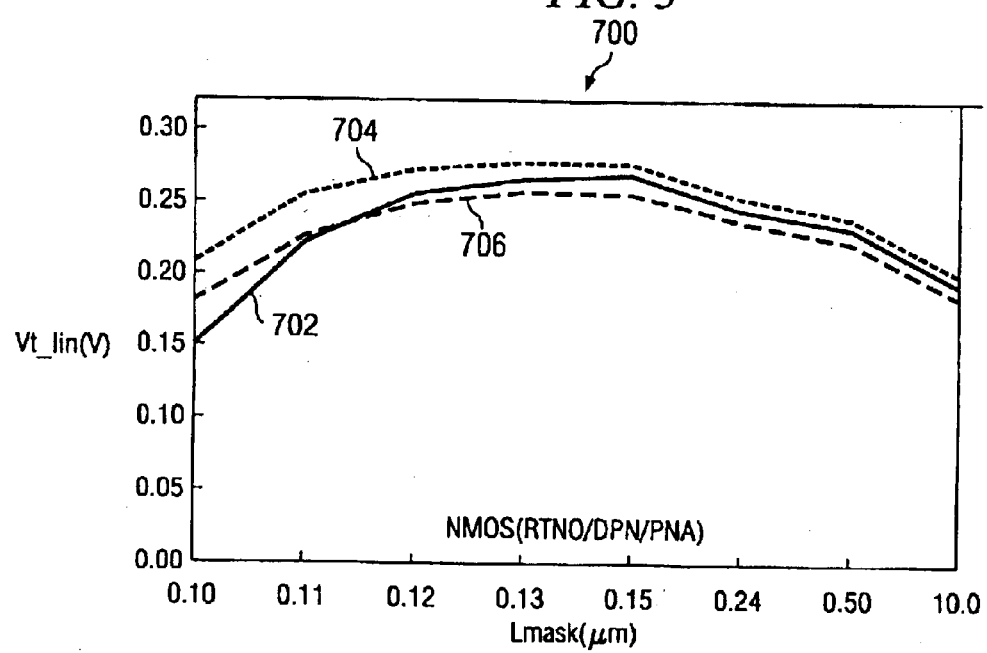
FIG. 5 is a plot of polysilicon line width versus linear threshold voltage for an NMOS device.

Referring now to FIG. 5, a plot 700 shows the relationship between a polysilicon line width $L_{mask}$ and a linear threshold voltage $V_{t\_in}$ for an NMOS device created using processes RTNO 104, DPN 106, and a post nitrogen anneal. Curve 702 shows the relationship when a heavy pre-gate phosphorous doping of $1 \times 10^{16}$ at/cm$^3$ is used during the polysilicon deposition process 108. Curves 704 and 706 show the relationship when a lower pre-gate phosphorous doping of $5 \times 10^{15}$ at/cm$^3$ is used during the polysilicon deposition process. The heavy pre-gate doping threshold voltage curve 702 shows more roll off approaching 0.1 micron, but the threshold voltage roll off of curves 704 and 706 are within a range of just 0.05 volts.

Figure 6:
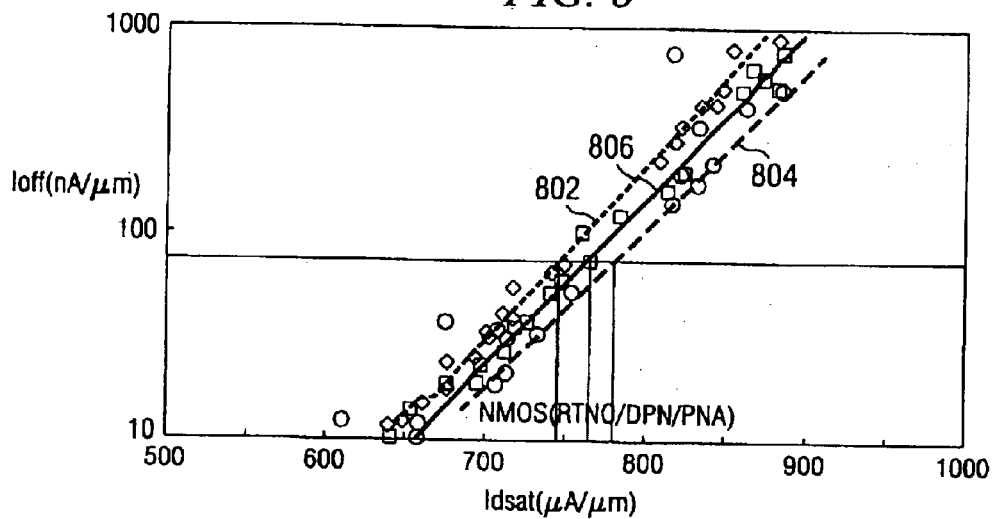
FIG. 6 is a plot of drain current saturation versus edge current for an NMOS device using processes including rapid thermal oxy-nitridation (RTNO), DPN, and a post nitrogen anneal.

Referring now to FIG. 6, a plot 800 shows the relationship between drain current saturation current $I_{dsat}$ and edge current $I_{off}$ for the NMOS device created using processes RTNO 104, DPN 106, and a post nitrogen anneal. This plot 800 shows the difference between a polysilicon created by the single wafer process and a furnace grown polysilicon. Curves 804 and 806 are created using a cluster tool "stacked" polysilicon versus curve 802 which is created with furnace grown polysilicon. Single wafer curves 804 and 806 have dosages of $1 \times 10^{16}$ at/cm$^3$ and $5 \times 10^{15}$ at/cm$^3$, respectively, and curve 802 has a phosphorous doping of $5 \times 10^{15}$ at/cm$^3$.

Figure 7:
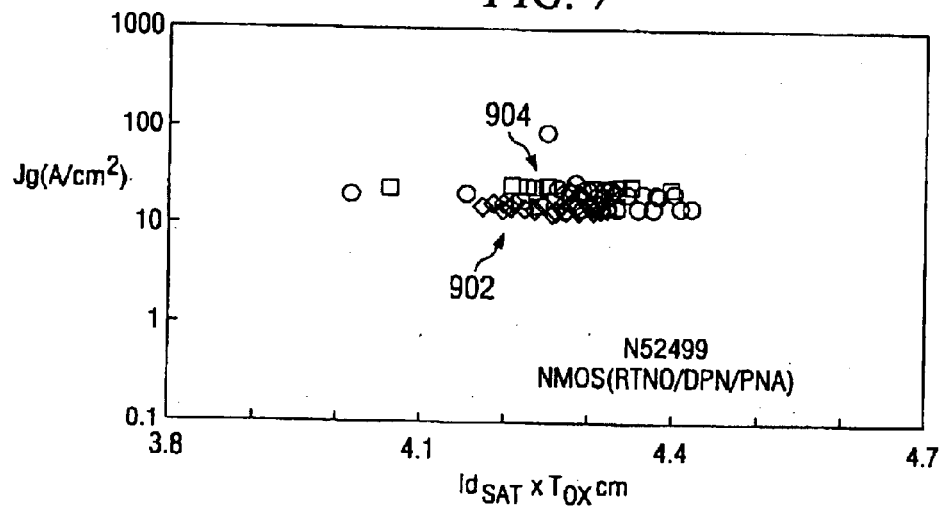
FIG. 7 is a plot of the product of drain saturation current and oxide thickness versus the gate leakage current.

Referring now to FIG. 7, the plot 900 shows the relationship between the product of the drain saturation current $I_{dsat}$ and the oxide thickness $T_{ox}CM$ (oxide 122 of FIG. 1b) and the gate leakage current $J_g$(A/cm2). The plot 900 shows very little difference between furnace polysilicon 902 and cluster tool "stacked" polysilicon 904 when both phosphorous dopant concentrations are $5 \times 10^{15}$ at/cm$^3$.

Figure 8:
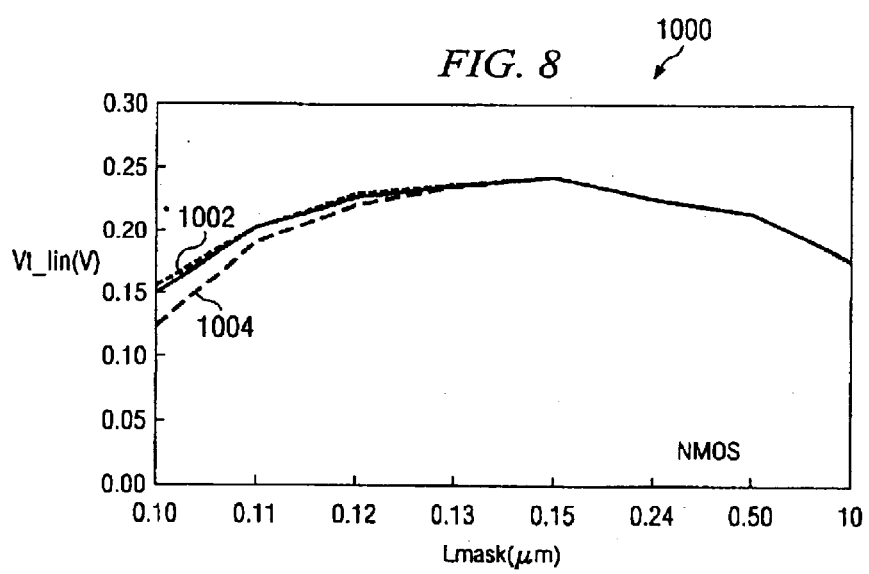
FIG. 8 is a plot of polysilicon line width versus linear threshold voltage for an NMOS device.

Referring now to FIG. 8, plot 1000 shows, in an NMOS case, the relationship between line width and linear threshold voltage $V_t$. The curve 1002 indicates little $V_t$ roll off near 0.01. micron for the optimized post-polysilicon clean 302, where as curve 1004, using cleaning methods 304, 306, 308, 310, 312 show much more $V_t$ roll off.

Figure 9:
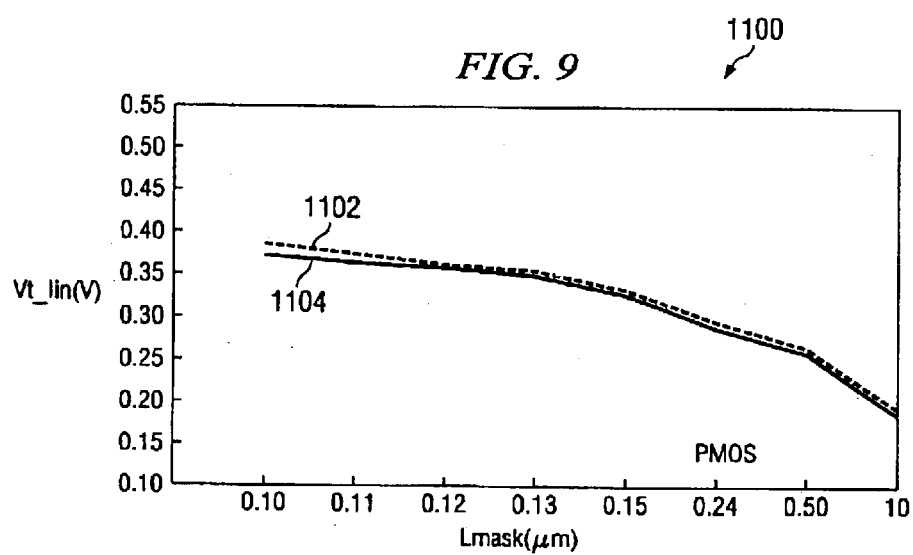
FIG. 9 is a plot of polysilicon line width versus linear threshold voltage for a PMOS device.

Referring now to FIG. 9, plot 1100 show, in a PMOS case, the relationship between line width and linear threshold voltage $V_t$. An insignificant difference can be observed in the threshold voltage when comparing cleaning methods 302 to 304, 306, 308, 310, 312.

The implementation of the optimized light NH$_4$OH cleaning method 302 can improve several key design specifications. For one, when the optimized cleaning method 302 is combined with the implementation of heavily pre-gate doping, the NMOS drain current improves without an increase in gate leakage current $J_g$. For another, using a light concentration of NH$_4$OH in the post polysilicon clean 110 can produce a reduction in the recession of the silicon relative to the alternative prior art cleaning methods 304, 306, 308, 310, 312. By reducing the silicon recession, a heavily doped pre-gate can be properly implemented to allow for the formation of shallower ultra shallow gate junctions that can be utilized for 0.065 micron devices.

The present invention has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for fabricating a metal oxide semiconductor (MOS) gate stack on a semiconductor substrate, the method comprising:

generating moisture on a surface of the semiconductor substrate;

performing a nitridation process on the moistened substrate;

after the nitridation process, performing a polysilicon deposition process on the surface of the semiconductor substrate; and cleaning the surface after the polysilicon deposition.

2. The method of claim 1 wherein the moisture is generated using a rapid thermal oxidation process.

3. The method of claim 1 wherein the moisture is generated using a rapid thermal oxy-nitridation process.

4. The method of claim 1 wherein the nitridation process utilizes decoupled plasma nitridation.

5. The method of claim 1 wherein the cleaning includes:

selecting a cleaner;

selecting an application type;

selecting a process time; and selecting a cleaner concentration.

6. The method of claim 5 wherein the cleaner is ammonia hydroxide.

7. The method of claim 5 wherein the application type is megasonic.

8. The method of claim 5 wherein the process time is approximately 30 seconds.

9. The method of claim 1 wherein the fabrication occurs in a cluster tool.

10. A method of creating a gate for a device in a semiconductor substrate, the method comprising:

forming a relatively thin gate dielectric on the substrate;

depositing a layer of polysilicon over the thin gate dielectric;

doping the polysilicon to a relatively high doping level; and cleaning the polysilicon layer with a cleaning solution including ammonia hydroxide.

11. The method of claim 10 wherein the device is a negative metal oxide semiconductor field effect transistor.

12. The method of claim 10 wherein the relatively high doping level is greater than or equal to $5 \times 10^{15}$ atoms/cm$^3$.

13. The method of claim 10 wherein the thin gate dielectric is less than or equal to 10 nanometers in thickness.

14. The method of claim 10 wherein the thin gate dielectric includes oxygen and nitrogen.

15. The method of claim 10 wherein the thin gate dielectric is formed by:

generating moisture on a surface of the semiconductor substrate; and performing a nitridation process on the moistened substrate.

16. A method for fabricating a metal oxide semiconductor (MOS) gate stack on a semiconductor substrate, the method comprising:

generating moisture on a surface of the semiconductor substrate to form an oxide layer less than 10 nanometers thin;

performing a nitridation process on the thin oxide layer;

after the nitridation process, performing a polysilicon deposition process on the surface of the semiconductor substrate;

doping the polysilicon deposition to a level of $5 \times 10^{15}$ atoms/cm$^3$; and cleaning the doped polysilicon with a light ammonia solution.

17. The method of claim 16 wherein the step of cleaning further includes performing megasonic agitation.

18. The method of claim 16 wherein the step of cleaning further includes sweeping the ammonia solution across the surface of the semiconductor substrate.

19. The method of claim 16 wherein the step of cleaning further includes using de-ionized water.

* * * * *